United States Patent [19]

Olschewski et al.

[11] 4,218,578

[45] Aug. 19, 1980

[54] RF SHIELD FOR AN ELECTRONIC COMPONENT

[75] Inventors: Wilfred W. Olschewski; Robert M. Stitt, both of Tucson, Ariz.

[73] Assignee: Burr-Brown Research Corp., Tucson, Ariz.

[21] Appl. No.: 931,145

[22] Filed: Aug. 4, 1978

[51] Int. Cl.² ............................................. H05K 9/00
[52] U.S. Cl. .................................. 174/35 R; 174/51; 361/424
[58] Field of Search .......... 174/35 R, 35 GC, 35 MS, 174/51; 361/424; 325/357; 330/68; 331/67; 334/85; 336/84 C

[56] References Cited

U.S. PATENT DOCUMENTS

| | | | |
|---|---|---|---|
| 1,709,054 | 4/1929 | Bennett | 336/84 C |
| 2,876,275 | 3/1959 | Schulz | 174/35 MS |
| 2,904,762 | 9/1959 | Schulz | 336/84 C |
| 3,475,682 | 10/1969 | Peek et al. | 336/84 R X |
| 3,883,715 | 5/1975 | Gebo | 331/67 X |

*Primary Examiner*—Elliot A. Goldberg
*Assistant Examiner*—D. A. Tone
*Attorney, Agent, or Firm*—Harry M. Weiss

[57] ABSTRACT

This disclosure relates to a housing or enclosure for an electronic component such as a hybrid module to provide RF shielding therefor. The RF shield has a gap separating two parts of the housing or enclosure to provide D.C. isolation between input and output electrical grounds. In one embodiment, the gap is attained by positioning a split metal sheet or layer within dielectric material such as an inner and outer layer of plastic material. Thus, the gap between the split portions of the RF shield is fixed, set or positioned during the formation of the sandwich dielectric-metal-dielectric structure. The gap has a very narrow spacing to obtain optimum RF shielding while still providing D. C. isolation. The dielectric material in the gap between the two split metal portions of the RF shield prevents electrical arcing between the split portions. In another embodiment, a dielectric, gap forming and metal holding (and separating) member is used to separate the two metal portions of the RF shield.

9 Claims, 6 Drawing Figures

RF SHIELD FOR AN ELECTRONIC COMPONENT

BACKGROUND OF THE INVENTION

1. Field of the Invention

This invention relates generally to electronic circuit components and, more particularly, to RF shielding enclosures for electronic circuit components.

2. Background of the Prior Art

In the past, various attempts have been made to provide RF shields around electronic circuit components in order to protect against the generation of highly dangerous and/or electrically disturbing RF radiation from electronic circuit components. The use of grounded shields for electronic components to prevent random RF transmission or interference is fairly common. In some applications, it is only necessary to enclose the component with some form of electrically conductive envelope member which is connected to a circuit ground. However, where circuit ground for the input circuit portion must be different than circuit ground for the output circuit portion, a single shield would provide a D.C. short between the two grounds. Thus, D.C. isolation must be provided for the separate input and output grounded portions of the RF shield, but yet maintain a high degree of RF shielding even with the use of a gap between the two split portions. Also, it was necessary to avoid undesirable arcing across a narrow gap between two separate portions of a RF shield.

Accordingly, a need existed to provide an improved RF shield for electronic components that would function as a good RF shield and still permit an excellent D.C. isolation to be achieved between the split portions of the RF shield while avoiding undesirable arcing across the gap between the split portions thereof.

SUMMARY OF THE INVENTION

Accordingly, it is an object of this invention to provide an improved RF shield for an electronic component.

It is a further object of this invention to provide an improved RF shield which provides a D.C. isolation gap.

It is a still further object of this invention to provide an improved RF shield having a D.C. isolation gap which substantially limits RF transmission.

In accordance with these objects, a RF shield for an electronic component is disclosed having a split electrically conductive metal base support comprising first and second electrically conductive metal sheets secured in place in spaced relationship by an encapsulating dielectric material defining a small gap therebetween. The RF shield further comprises a cover portion that has first and second electrically conductive metal portions secured in spaced relationship by an encapsulating dielectric material and also defining a small gap between the first and second electrically conductive metal portions. Means are provided for connecting the first and second metal sheets, respectively, to the first and second metal portions of the cover or hood and permit the gaps to be in alignment when the RF shield functions as an enclosure for an electronic circuit member. The base support of the RF shield is provided with a plurality apertures through which means for providing electrical connection to the electronic circuit member extend. An electrical ground connector is provided for each of said first and second electrically conductive metal portions of the cover or hood. The base support has notches in the encapsulating dielectric material exposing portions of the first and second metal sheets. The cover has metal tabs extending outwardly therefrom which are clinched or electrically connected to the first and second metal sheets to provide electrical connection, respectively, between the first metal sheet of the base support member and the first electrically conductive metal portion of the hood or cover and between the second metal sheet of the base support member and the second electrically conductive metal portion of the hood or cover. Thus, these metal tabs of the cover or hood provide both electrical and mechanical connection between conductive portions of the base support and the cover. Preferably, the aligned gaps in the RF shield are approximately 0.05 inches apart and provide D.C. isolation between input and output grounds for the electronic circuit member contained within the RF shield. However, the width of the gap can range from about 0.01 to about 0.15 inches.

BRIEF DESCRIPTION OF THE DRAWINGS

Further objects and advantages of the invention will be understood from the following complete description thereof and from the drawings wherein.

DESCRIPTION OF THE SPECIFICATION

As noted, the general use of grounded shields for electronic components to prevent random RF transmission or interference is fairly common. In some applications, it is only necessary to enclose the electronic component with some form of conductive member which is connected to a circuit ground. However, in applications where circuit ground for the input circuit must be different than and electrically isolated from circuit ground for the output circuit, a single shield would provide a D.C. short between the two grounds. Thus, D.C. isolation must be provided and yet maintain a good RF shield.

This is accomplished in accordance with the invention by providing an RF shield or enclosure for an electronic component which uses a single continuous gap therein formed by two contiguous gaps to provide D.C. isolation between input and output grounds. In one embodiment, the separate gaps may be attained and maintained by securing metal portions and sheets in spaced relation to each other by dielectric material using a transfer molding process.

Figure 1:
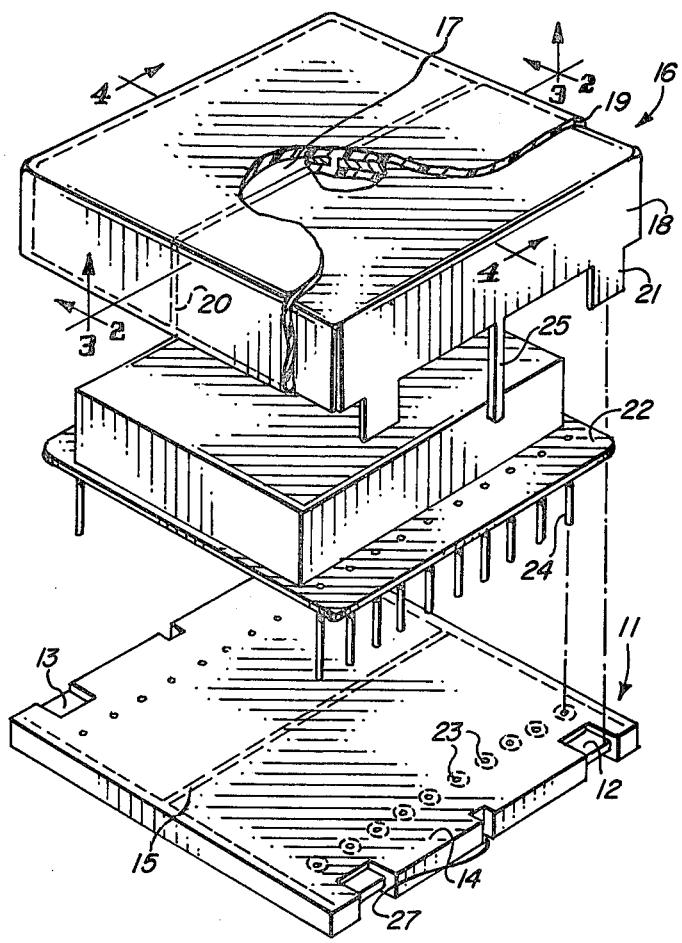
FIG. 1 is an exploded perspective view of an electronic package including an RF shield in accordance with the invention.

As shown in FIG. 1, the RF shield has a base support element or member 11 having first and second conductive sheets 12 and 13 secured in spaced relationship to each other (separated by a small gap) by an encapsulating dielectric material 14 thereby defining a gap 15 therebetween. A cover or hood 16 has first and second metal portions 17 and 18 secured in spaced relationship to each other by an encapsulating dielectric material 19 thereby defining a gap 20 therebetween. Means in the form of metal tabs 21 extending from the first and second metal portions 17 and 18 of the cover 16 connect the first and second conductive sheets 12 and 13 respectively, to the second and first metal portions 18 and 17 so that the gaps 15 and 20 become aligned to define a single continuous gap in an RF shield or enclosure for an electronic circuit member 22 (which is shown in this embodiment to be a substrate having one or more semiconductor chips located thereon and electrically connected to portions of the substrate to provide an electronic function).

Figure 2:
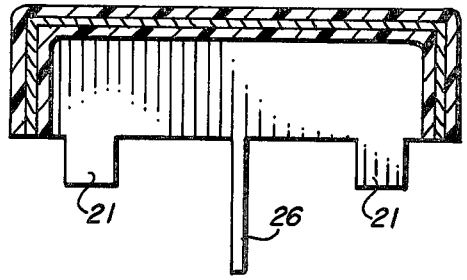
FIG. 2 is a side cross-sectional view of a portion thereof taken on line 2—2 of FIG. 1 showing the intermediate metal layer between two dielectric layers.
Figure 3:
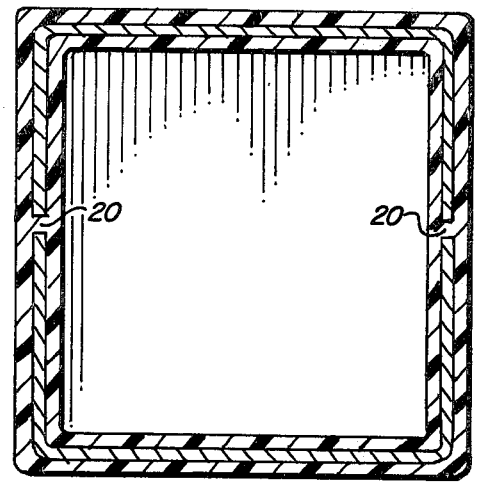
FIG. 3 is a bottom cross-sectional view taken on line 3—3 of FIG. 1 showing the location of the small gap in the metal layer that is located between the dielectric layers.
Figure 4:
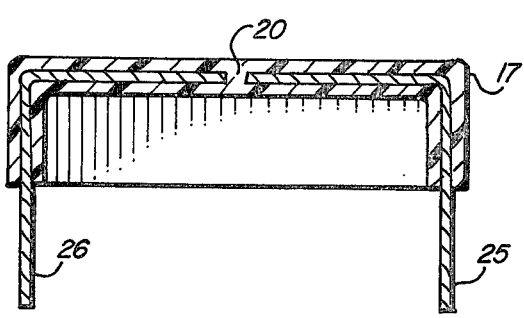
FIG. 4 is a side cross-sectional view taken on line 4—4 of FIG. 1 showing the location of the small gap electrically separating the two metal portions of the cover.

As better seen in FIGS. 2–4, the dielectric material 14 or 19 is layered on both sides of the sheets 12 and 13 and metal portions 17 and 18 by, for example, injection molding.

Figure 5:
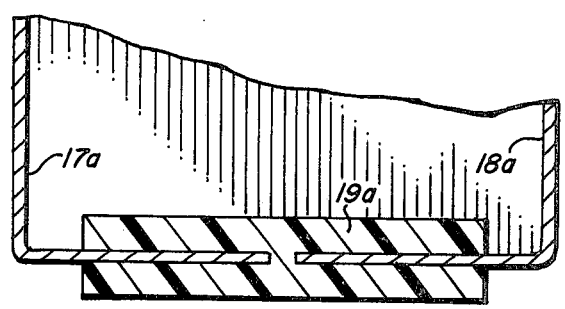
FIG. 5 is a side cross-sectional view of a portion of the electronic package of FIG. 1 after the assembly thereof.

Referring to FIG. 1, the base support member 11 is provided with a plurality of apertures 23 through which connecting metal pins 24 of the electronic circuit member may extend (see FIG. 5). These pins 24 do not make electrical contact to either the first or the second metal sheets 12 and 13 due to the formation of openings in these two sheets around the apertures 23 (as shown on the right side portion of FIG. 1, the openings on the other side of support member 11 are the same although the detail is not shown as depicted on the right side portion).

Electrical ground connectors 25 and 26 are provided as metal extensions for the second and first metal portions 18 and 17 (which, if desired, can be considered as the first and second metal portions). These connectors 25 and 26 (see FIG. 2 or 4) are normally connected to input and output grounds for the circuit contained in the electronic circuit member or device 22. The gaps 15 and 20 thus provide D.C. isolation between these separate input and output grounds. The base support member 11 has two notches 27 at opposite sides thereof in the dielectric material for the insertion therein of the two ground connectors 25 and 26. Other notches in the base support member (two on each side) are for exposing portions of the sheets 12 and 13 (FIG. 1) for electrical connection thereto by the tabs 21. As shown in FIG. 5, when the cover 16 is assembled with the base support 11, the tabs 21 are clinched or press fitted into both electrical and mechanical contact with the portions of the sheets 12 and 13 exposed by the four notches located on the two sides of the base support member 11. The sheets 12 and 13 and the metal portions 17 and 18 are of a ferromagnetic material such as iron, nickel or the like and preferably an electrically conductive ferromagnetic material. In some applications, it may only be necessary to use a non-ferromagnetic conductive material.

It is necessary that the gaps 15 and 20 be of the order of approximately 0.05 inches in order to significantly minimize RF transmission therethrough and yet provide D.C. isolation between the input and output ground portions of the RF shield.

Figure 6:
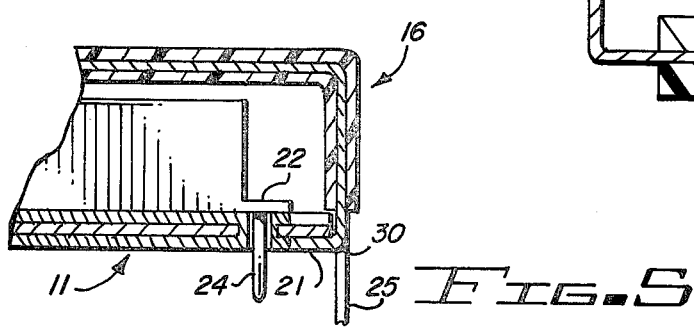
FIG. 6 is a view similar to FIG. 4 of a further embodiment of the invention.

In the embodiment of FIG. 1, the dielectric material overlay or encapsulate substantially all surfaces of the sheets and the metal portions. However, in a further embodiment as shown in FIG. 6, dielectric material 19a overlays metal end portions 17a and 18a only adjacent to the gap. Thus, less dielectric material is utilized. Similarly, the amount of dielectric material in the base support member may be similarly reduced with the use of this type of dielectric member.

Thus, the dielectric member or material of the FIG. 6 embodiment functions to permit the holding of the end portions of the metal portions (or the conductive sheets) and to precisely form the gap therebetween. In both embodiments, the dielectric material in the gap or gaps (15 and 20) prevents undesired and destructive electrical arcing between the two separated metal edge portions of the sheets or the metal portions which would otherwise occur if there were no dielectric material between the small gap between the metal edges thereof.

It is thus seen that there is provided a RF shield for an electronic device or component which has a D.C. isolation gap not permitting RF transmission.

While the invention has been described by way of the preferred embodiments of the invention, it will be understood that auitable modifications may be made therein without departing from the spirit and scope of the invention.

What is claimed is:

1. An RF shield for an electronic device comprising, in combination, a base support member having first and second conductive sheets secured in spaced relationship to each other by encapsulation in dielectric material thereby defining a gap therebetween, a cover having first and second metal portions secured in spaced relationship to each other by encapsulation in dielectric material thereby defining a gap therebetween, and means for connecting said sheets and said metal portions together to define a D.C. isolated RF shield enclosure for said electronic device.

2. An RF shield as recited in claim 1 further including a separate electrical ground connector coupled to each of said first and second metal portions of said cover.

3. An RF shield for an electronic device comprising, in combination, a base support member having first and second conductive sheets secured in spaced relationship to each other by dielectric material thereby defining a gap therebetween, said base support member being provided with a plurality of apertures through which means for electrically connecting the electronic device may extend, a cover having first and second metal portions secured in spaced relationship to each other by dielectric material thereby defining a gap therebetween, and means for connecting said sheets and said metal portions together to define a D.C. isolated RF shield enclosure for said electronic device, the dielectric material of said base support member encapsulating said first and second conductive sheets having notches therein exposing portions of the sheets, and said cover having metal tabs outwardly extending from said metal portions of said cover which are clinched to said sheets of said base support member.

4. A RF shield as recited in claim 3 wherein said metal tabs provide electrical and mechanical connection between said base support member and said cover.

5. A RF shield as recited in claim 3 wherein said sheets and said portions are of an electrically conductive ferromagnetic material.

6. A RF shield as recited in claim 3 wherein said gaps are in the range of from about 0.01 to about 0.15 inches.

7. A RF shield as recited in claim 6 wherein said gaps provide D.C. isolation between input and output grounds for the electronic device.

8. A RF shield as recited in claim 3 wherein the dielectric material overlaps substantially all surfaces of said sheets and said metal portions.

9. A RF shield as recited in claim 3 wherein the dielectric material overlays the sheets and metal portions only adjacent to the gaps.

* * * * *